United States Patent
Seifert et al.

[11] Patent Number: 5,593,465
[45] Date of Patent: Jan. 14, 1997

[54] MOUNTING FOR CARRIER BODIES IN AN APPARATUS FOR THE DEPOSITION OF SEMICONDUCTOR MATERIAL

[75] Inventors: Dieter Seifert, Neuoetting; Heinz Kraus, Zeilarn, both of Germany

[73] Assignee: Wacker-Chemie GmbH, München, Germany

[21] Appl. No.: 490,303

[22] Filed: Jun. 14, 1995

[30] Foreign Application Priority Data

Jul. 14, 1994 [DE] Germany ............................ 44 24 929.2

[51] Int. Cl.[6] .................................................. H01L 21/68
[52] U.S. Cl. ......................... 29/25.01; 437/925; 118/729
[58] Field of Search .......................... 118/729; 29/25.01; 437/925

[56] References Cited

U.S. PATENT DOCUMENTS

| | | | |
|---|---|---|---|
| 4,141,764 | 2/1979 | Authier et al. ........................ 148/174 |
| 4,160,797 | 7/1979 | Goppinger et al. .................... 264/81 |
| 4,173,944 | 11/1979 | Köppl et al. . | |
| 4,311,545 | 1/1982 | Bugl et al. ........................... 156/613 |

*Primary Examiner*—John Niebling
*Assistant Examiner*—David E. Graybill
*Attorney, Agent, or Firm*—Collard & Roe, P.C.

[57] ABSTRACT

Mounting for carrier bodies in an apparatus for the deposition of semiconductor material on heated carrier bodies, having a fixed current leadthrough passed through the base plate of the deposition apparatus, an electrode holder, and a graphite electrode. There is also at least one spring element which is disposed between the current leadthrough and the electrode holder, which permits a movement of the electrode holder relative to the current leadthrough and which cushions this movement.

5 Claims, 2 Drawing Sheets

MOUNTING FOR CARRIER BODIES IN AN APPARATUS FOR THE DEPOSITION OF SEMICONDUCTOR MATERIAL

BACKGROUND OF THE INVENTION

1. Field of the Invention

The present invention relates to mountings for carrier bodies in an apparatus for the deposition of semiconductor material on heated carrier bodies and a preferred use of such mountings.

2. The Prior Art

Apparatuses for the deposition of semiconductor material on heated carrier bodies have been known for a long time. For example, see U.S. Pat. No. 4,173,944. In the most common embodiment, such apparatuses comprise essentially a metallic base plate and a coolable bell jar which is placed on the base plate so that a closed reaction chamber is produced in the interior of the bell jar. The deposition apparatus must be capable of being closed in a gas tight and pressure proof manner. This is because the deposition is usually carried out with the application of pressure; and the deposition gases have corrosive action and a tendency to ignite spontaneously when mixed with air. The base plate is provided with mountings upon which the carrier bodies are supported in the reaction chamber. Normally, rods which are heated to the necessary deposition temperature by direct passage of electric current serve as carrier bodies. Expediently, two adjacent rods are connected at their free ends which are opposite to the supported base ends, by a bridge to form a U-shaped carrier body. The electric current is supplied by the pair of mountings supporting the U-shaped carrier body.

A mounting includes a current leadthrough which passes through the base plate and is connected to a current source outside the deposition apparatus. Inside the deposition apparatus, the current leadthrough is constructed as an electrode holder or is permanently connected to a separate electrode holder. Mounted on the electrode holder is a graphite electrode which is directed into the reaction chamber. The graphite electrode normally has a recess at the top into which the carrier body is inserted. The mountings are designed so that the supported carrier bodies are fixed in position and cannot be moved. The current leadthrough and, if applicable, also the electrode holder are provided with a cooling channel through which a coolant is pumped during the deposition. This prevents semiconductor material from depositing on the mounting of the carrier body.

Since the development of the first deposition apparatuses, there has been a continuous tendency to produce semiconductor bodies with ever larger volumes by depositing semiconductor material on heated carrier bodies. At present, semiconductor rods whose length is up to 3000 mm and whose diameter is up to 200 mm are produced using rod-shaped carrier bodies. In the production of large semiconductor bodies, it can be observed relatively frequently that, in the final stage of the deposition or during the cooling phase after the deposition they are damaged by cracks. This phenomenon causes a high financial loss since damaged semiconductor bodies can no longer be further processed as planned.

SUMMARY OF THE INVENTION

It is an object of the present invention to provide mounting means which substantially prevent the disadvantages described above.

This object is achieved by a mounting means for carrier bodies which comprises at least one spring element which is disposed between the current leadthrough and the electrode holder, which permits a movement of the electrode holder relative to the current leadthrough and which cushions this movement.

Investigations by the inventors have shown that thermal stresses are ultimately responsible for the disadvantageous effects of the prior art. The causes of such thermal stresses are the cooled mountings, differences in the semiconductor body with regard to the rate of cooling after the deposition and, in the case of U-shaped semiconductor bodies, the shrinkage of the bridge joining the rods during the cooling phase.

A mounting in accordance with the present invention permits sufficient intrinsic movement of the semiconductor bodies so that the thermal stresses are reduced. A further advantage of the invention mounting is that already existing deposition apparatuses can be retrofitted with it.

BRIEF DESCRIPTION OF THE DRAWINGS

Other objects and features of the present invention will become apparent from the following detailed description considered in connection with the accompanying drawing which discloses two embodiments of the present invention. It should be understood, however, that the drawing is designed for the purpose of illustration only and not as a definition of the limits of the invention, in which.

DETAILED DESCRIPTION OF PREFERRED EMBODIMENTS

Figure 1:
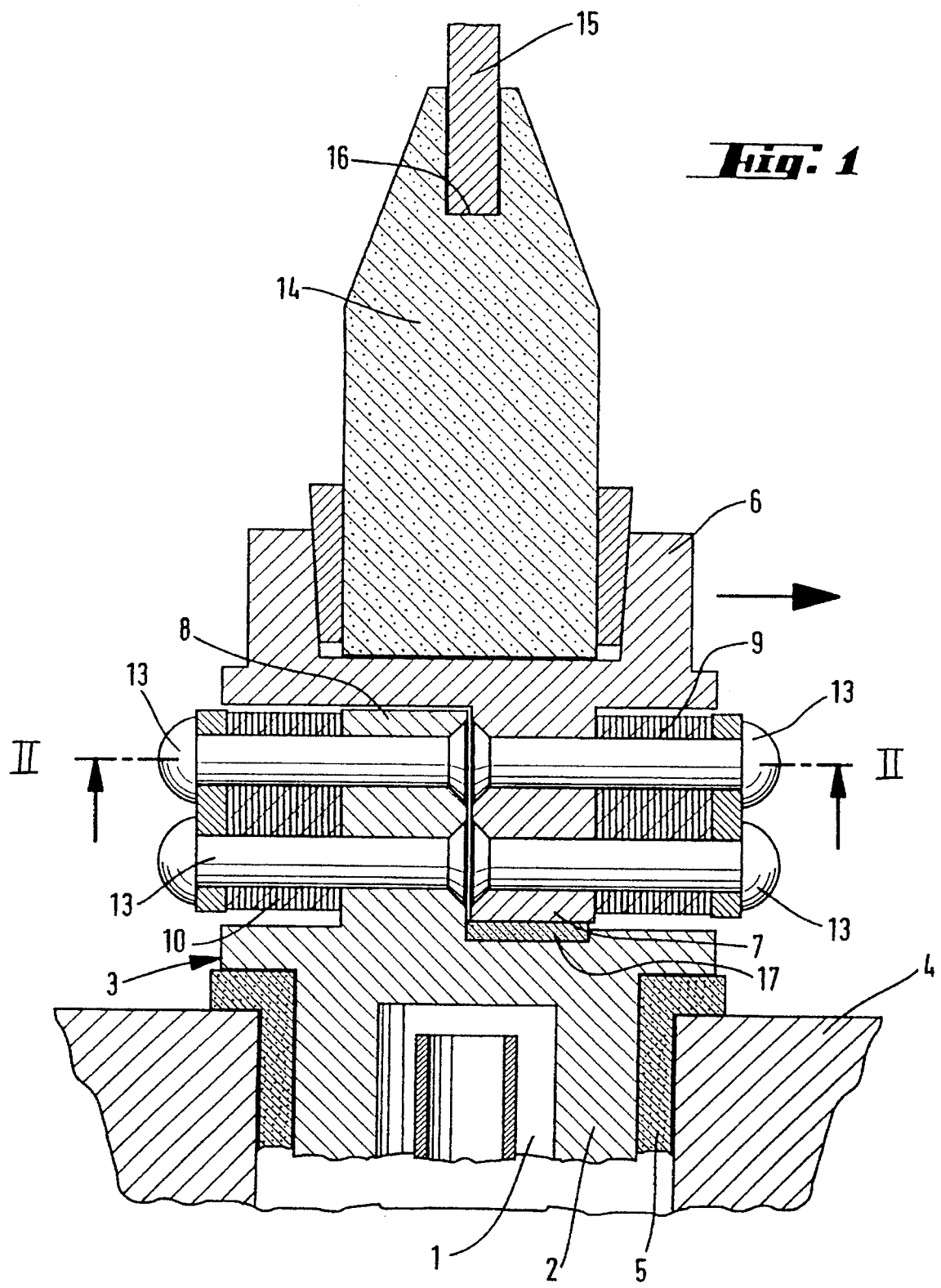
FIG. 1 shows a longitudinal section through a mounting having two spring elements.
Figure 2:
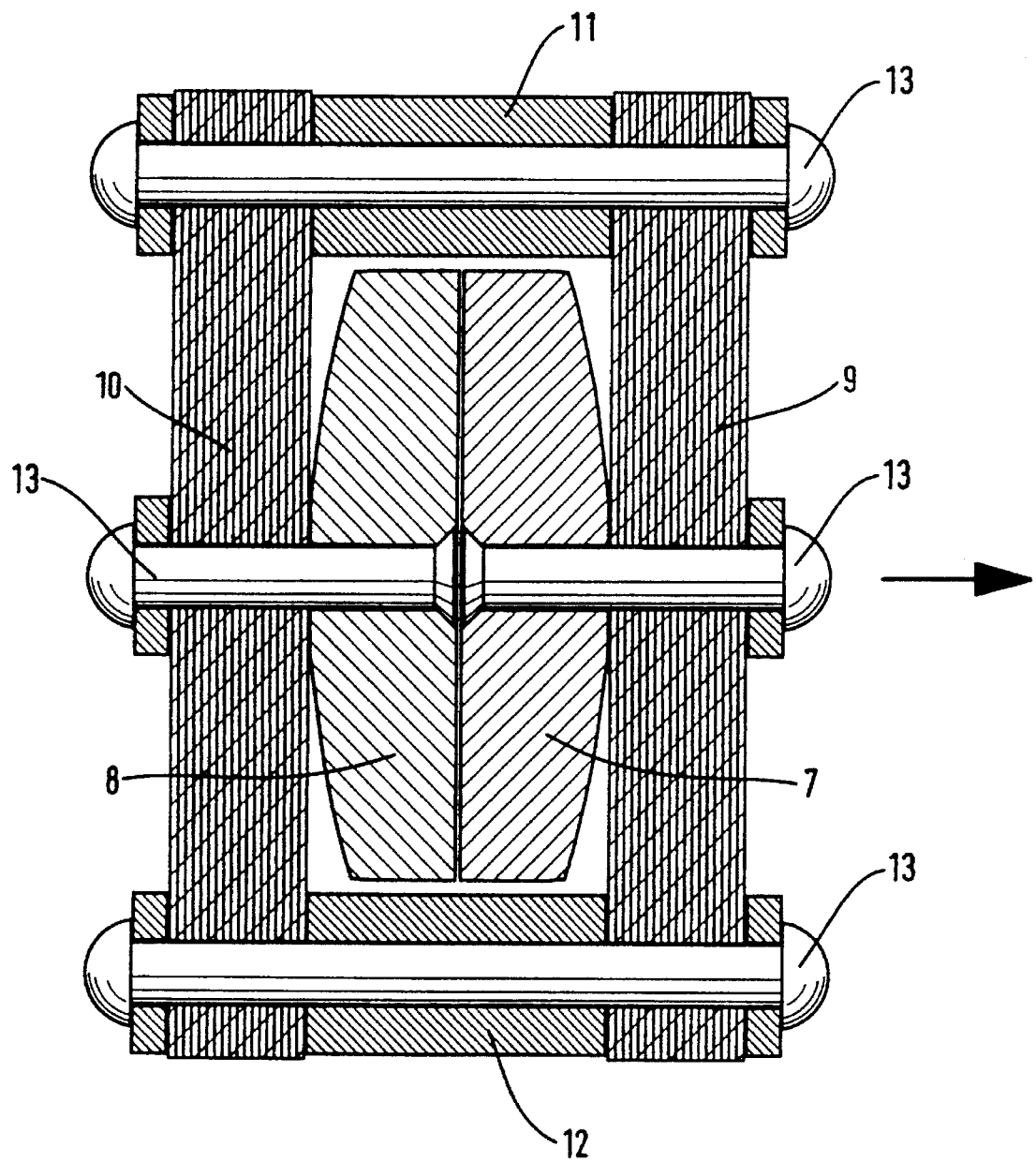
FIG. 2 shows a cross section through said mounting, the section having been made along the line A—A shown in FIG. 1.

Turning now in detail to the drawings, as shown in FIG. 1, the current leadthrough 2 of the lower section of the mounting 3, which leadthrough 2 is provided with a cooling channel 1, passes through an opening in the base plate 4 of a deposition apparatus. The current leadthrough 2 is electrically insulated from the base plate 4 by an insulation 5. The insulation 5 and the current leadthrough 2 jointly close the opening in the base plate in a gas tight and pressure-proof manner. In the installed state, the current leadthrough is seated in a fixed and immovable manner in the opening. On the other hand, the electrode holder 6 is disposed above the current leadthrough 2 and covering the latter is able to move, in particular, in the direction specified with an arrow. In addition to this horizontal translational movement in the direction of the arrow, the spring elements also permit a slight tipping movement of the electrode holder. The electrode holder 6 is extended to form a ridge 7 at its bottom. This ridge initially rests contiguously against an extension 8, which is also ridge-like, of the current leadthrough 2 (FIG. 2). Only if a force deflects the electrode holder in the arrow direction does a gap having a width equal to the path traversed by the electrode holder arise between the fixed ridge 8 belonging to the current leadthrough and the ridge 7 of the deflected electrode holder. According to the view shown in the figures, the movement of the electrode holder is made possible by two spring elements 9, 10 which are disposed between the current leadthrough 2 and the electrode holder 6. The spring elements are elastically deformable in the direction of the movement of the electrode holder and cushion movement of the electrode holder.

In accordance with the preferred embodiment of the invention, a spring element comprises a stack of leaf springs which are aligned perpendicularly with respect to the direction of the movement. The spring elements 9, 10 are joined together at their side edges by means of the spacers 11, 12. One of the two spring elements is joined in the center to the ridge 7 and the other to the ridge 8. The joining of the two spring elements and the joining of a spring element to the adjacent ridge can be performed by means of rivets 13 or, for example, also in a screwed or welded manner. As shown in FIG. 2, those side faces of the ridges which are contiguous with the spring elements are preferably of slightly rounded design so that, during the horizontal translational movement of the electrode holder, the leaf springs can fit closely against said faces.

As a component of the mounting 3, the graphite electrode 14 is joined in a manner known per se to that side of the electrode holder which is opposite the base plate 4. The carrier body 15 is inserted into a recess 16 in the conically tapering tip of the graphite electrode 14. The gravitational force acting on the electrode holder can be buttressed by the current leadthrough either via the spring elements or directly. A preferred embodiment of the invention provides at least one sliding bearing 17, for example a graphite sliding block, which buttresses the weight of the carrier body.

Although the figures show a mounting having two spring elements which are disposed in a specularly symmetrical manner, even one of the spring elements is sufficient to provide the intended movement facility for the electrode mounting. In the case of a mounting having only one spring element, a suitably widened ridge belonging to the electrode holder or to the current leadthrough occupies the position of the second spring element.

The mounting must be able to conduct electrical current and heat well and, in addition, be corrosion-resistant. It is therefore particularly preferable to make the current leadthrough, the electrode mounting, the spring elements and the fixing means joining them of silver or at least to coat them with silver.

In a pair of mountings in which the base ends of a U-shaped carrier body are supported, at least one of the mountings should be a mounting of the type according to the invention. The mounting is disposed on the base plate of the deposition system in such a way that the horizontal translational movement of the electrode holder can take place in the direction of the second mounting of the pair. If the spacing of the base ends of the semiconductor body produced shortens at the end of the deposition or during the cooling phase as a consequence of thermal stresses occurring, the movable mounting does not present any damaging resistance to the shortening movement. On the contrary, particularly in the case of large semiconductor bodies, the use of two rigid mountings would result with some probability in the damaging of the semiconductor body While several embodiments of the present invention have been shown and described, it is to be understood that many changes and modifications may be made thereunto without departing from the spirit and scope of the invention as defined in the appended claims.

What is claimed is:

1. A mounting for a carrier body in an apparatus for the deposition of semiconductor material on a heated carrier body, said apparatus having a base plate, said mounting comprising a fixed current leadthrough passing through the base plate of the deposition apparatus;

an electrode holder having a bottom which is disposed above the current leadthrough and a top which is joined to a graphite electrode into which a carrier body can be inserted; and at least one spring element which is disposed between the current leadthrough and the electrode holder, which permits a movement of the electrode holder relative to the current leadthrough and which cushions said movement.

2. The mounting as claimed in claim 1, wherein said at least one spring element comprises leaf springs which are assembled to form a stack and are aligned perpendicularly with respect to the direction of the movement.

3. The mounting as claimed in claim 1, further comprising a second spring element which is disposed in a specularly symmetrical manner with respect to said one spring element; and spacer means for joining said second spring element to said one spring element.

4. The mounting as claimed in claim 1, further comprising a sliding bearing for buttressing the weight of the carrier body.

5. A pair of mountings for supporting two base ends of a heated U-shaped carrier body in an apparatus for the deposition of semiconductor material on said heated carrier body, comprising at least one mounting as claimed in claim 1; and the one mounting being aligned so that a movement of the electrode holder can take place in the direction of a second mounting of the pair of mountings.

\* \* \* \* \*